(12) United States Patent
Lee

(10) Patent No.: US 6,884,682 B2
(45) Date of Patent: Apr. 26, 2005

(54) METHOD FOR MANUFACTURING FLASH MEMORY DEVICE

(75) Inventor: Byoung Ki Lee, Kyungki-Do (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/734,533

(22) Filed: Dec. 12, 2003

(65) Prior Publication Data

US 2004/0266111 A1 Dec. 30, 2004

(30) Foreign Application Priority Data

Jun. 30, 2003 (KR) .................................. 10-2003-0043400

(51) Int. Cl.[7] .................... H01L 21/336; H01L 21/8234
(52) U.S. Cl. ........................ 438/258; 438/264; 438/259; 438/275; 438/296
(58) Field of Search .............................. 438/264, 258, 438/259, 275, 296

(56) References Cited

U.S. PATENT DOCUMENTS 6,284,607 B1 * 9/2001 Patelmo et al. ............. 438/275
6,576,517 B1 * 6/2003 Patelmo et al. ............. 438/275
6,759,299 B2 * 7/2004 Lee et al. .................... 438/258

* cited by examiner

Primary Examiner—David E. Graybill
(74) Attorney, Agent, or Firm—Marshall, Gerstein & Borun LLP

(57) ABSTRACT

The present invention relates to a method of manufacturing a flash memory device. In a flash memory device formed by applying a self-align shallow trench isolation (SA-STI) scheme, a polishing process and a process for removing a nitride film are performed after oxide materials are buried in isolation trenches. Then, oxide films with an excellent planarization are formed, a first etching process is performed to selectively remove the oxide films in a low voltage transistor/cell area to a certain thickness, a second etching process is performed to remove the oxide films in a high voltage transistor area and the low voltage transistor/cell area until a poly-silicon layer for a floating gate is exposed. Therefore, protruding portions of element isolation films in the high voltage transistor area and the low voltage transistor/cell area are etched away to a certain thickness during the first and second etching processes so that a difference in EFH's between these areas can be reduced.

8 Claims, 4 Drawing Sheets

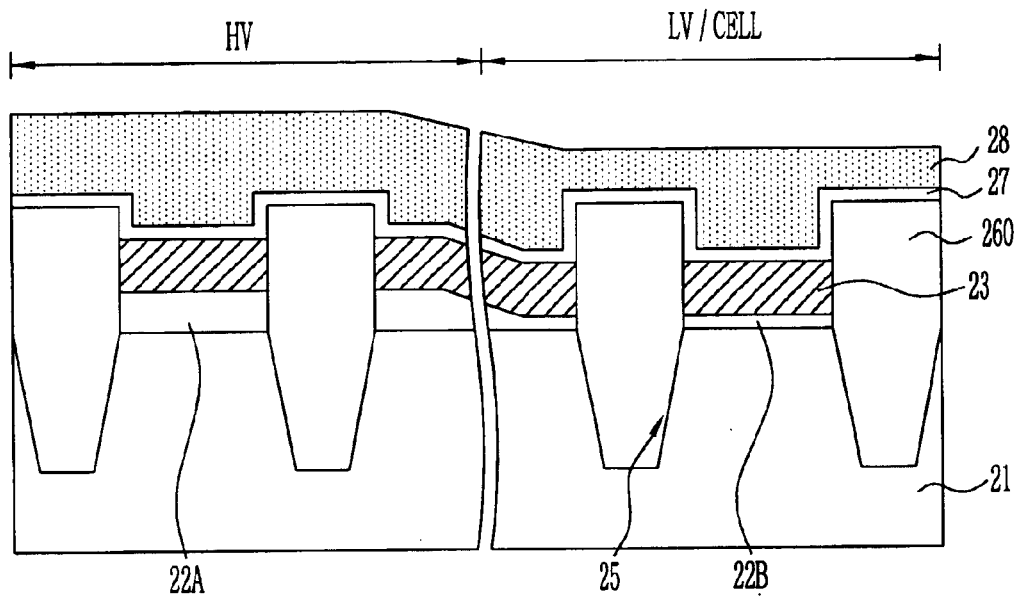
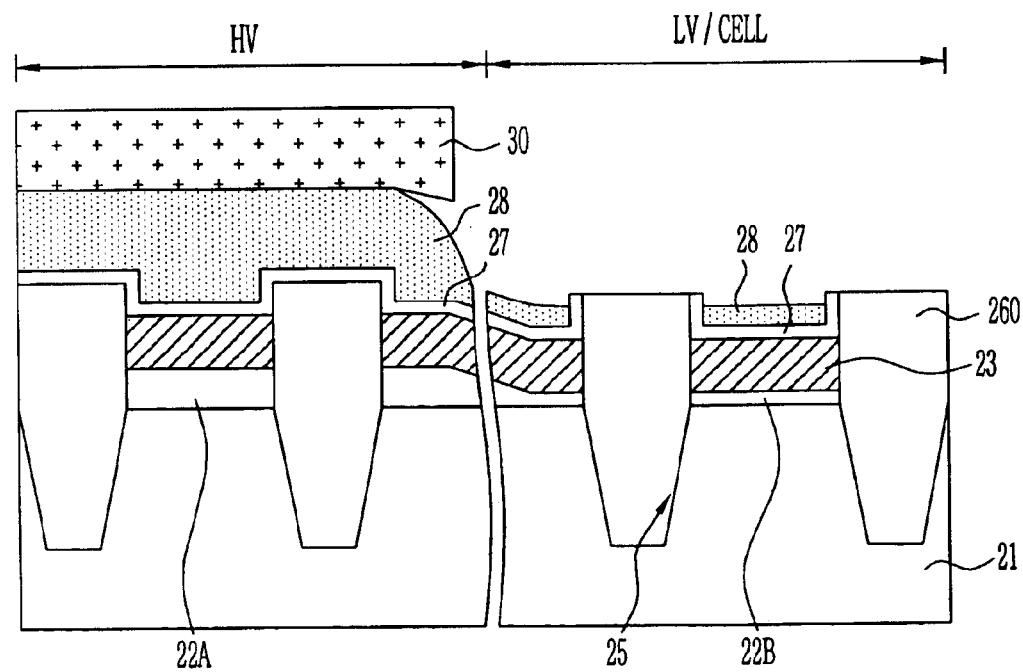

METHOD FOR MANUFACTURING FLASH MEMORY DEVICE

BACKGROUND

1. Field of the Invention

The present invention relates to a method of manufacturing a flash memory device, and more particularly to a method of manufacturing a flash memory device capable of reducing a difference in effective field oxide heights ("EFH") between a high voltage transistor area, and a low voltage transistor/cell area, which is caused by respective protruding portions of element isolation films thereon in a flash memory device manufactured by applying a self-align shallow trench isolation ("SA-STI") scheme.

2. Discussion of Related Art

Basically, a flash memory device has low voltage transistors and high voltage transistors in order to drive cells according to necessary properties. Usually, a gate oxide film for the high voltage transistor is made to be thick, on the other hand, in case of the low voltage transistor, it is made to be thin. The thickness of a gate oxide film for a cell is equal or similar to that for a low voltage transistor. The steps caused by a difference in thickness of the gate oxide films between the high voltage transistor area and the low voltage transistor/cell area result in different thickness of the nitride films which remain after the subsequent chemical mechanical polishing for forming the element isolation films in each of areas. Also, this generates a difference in EFH's between the high voltage transistor area and the low voltage transistor/cell area. Herein, the EFH means a difference in heights of the element isolation films based on the contact surface of a first poly-silicon layer for a floating gate and a second poly-silicon layer for a floating gate.

Shown in FIG. 1 is a cross-sectional view illustrating a conventional method of manufacturing a flash memory device formed by applying a self-align shallow trench isolation scheme. Although a flash memory device includes a cell area, a low voltage transistor area, and a high voltage transistor area, the cell area and the low voltage transistor area will be considered as one area—the low voltage transistor/cell area—in the following descriptions for easier understanding because the thickness of their gate oxides is similar to each other.

Referring to FIG. 1, a gate oxide film 12A for a high voltage is formed on a semiconductor substrate 11 in a high voltage transistor area HV, and another gate oxide film 12B for a low voltage/cell is formed on a semiconductor substrate 11 in a low voltage transistor/cell area LV/CELL. The gate oxide film 12A in a high voltage transistor area HV is thicker than the gate oxide film 12B in a low voltage transistor/cell area LV/CELL. A first poly-silicon layer 13 for a floating gate is formed on the gate oxide films 12A and 12B. A plurality of isolation trenches are formed on the semiconductor substrate 11 by performing an SA-STI process. Thereafter, element isolation films 160 are formed by filling isolation oxide materials into the trenches 15. A second poly-silicon layer 19 for a floating gate is formed on the whole surface of the structure, including the element isolation films 160. Although it is not shown in the drawing, gates are formed on respective areas by performing an etching process using a mask for a floating gate, a process of forming a dielectric film, a process of forming a conductive layer for a control gate, and an etching process using a mask for a control gate.

According to the conventional method of manufacturing a flash memory device described above, each of protruding portions of element isolation films 160 in the high voltage transistor area HV and the low voltage/cell area LV/CELL causes a difference in EFH's between these areas. Generally, the effective field oxide height EFH1 based on the first poly-silicon layer 13 in the high voltage transistor area HV becomes (−) 50 to 100 Π, whereas the effective field oxide height EFH2 based on the first poly-silicon layer 13 in the low voltage transistor/cell area LV/CELL becomes in the range of 300 Π to 800 Π. The effective field oxide height EFH2 in the low voltage transistor/cell area LV/CELL has a higher and wider range of values. Furthermore, the values become different depending on the processing conditions of a chemical mechanical polishing. Such a difference in EFH's between the high voltage transistor area HV and the low voltage transistor/cell area LV/CELL and the high value of EFH's in the low voltage transistor/cell area LV/CELL, causes some problems such as difficulties in establishing a gate etching target for each area, bad pattern profiles of the gate, and reasons of failures caused by the poly-silicon remnants. Since these problems become important as devices are highly integrated, continuous efforts have been made to solve them.

SUMMARY OF THE INVENTION

Accordingly, the present invention is directed to provide a method of manufacturing a flash memory device capable of reducing a difference in effective field oxide heights between a high voltage transistor area and a low voltage transistor/cell area, which is caused by respective protruding portions of element isolation films thereon so as to ensure process safety and improve device reliability.

According to the present invention, a method of manufacturing a flash memory device includes providing a semiconductor substrate having a high voltage transistor area in which a first gate oxide film and a first poly-silicon layer are formed between first element isolation films, and a low voltage transistor/cell area in which a second gate oxide film and the first poly-silicon layer are formed between second element isolation film. The method also includes forming a planarizing film on the surfaces of the first poly-silicon layer and the first and second element isolation films, removing upper portions of the planarizing film and the element isolation films in the low voltage transistor/cell area to a certain thickness by performing a first etching process, and removing upper portions of the planarizing film and the element isolation films in the high voltage transistor area and the low voltage transistor/cell area by performing a second etching process. The method also includes forming a second poly-silicon layer on surfaces of the first poly-silicon layer and the element isolation films.

In addition, the first and second etching processes are performed by a wet etching process using an oxide etching solution with HF added.

Furthermore, the first and second etching processes can be performed to obtain effective field oxide heights in the high voltage transistor area and the low voltage transistor/cell area of about (−) 100 to about 50 Π.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
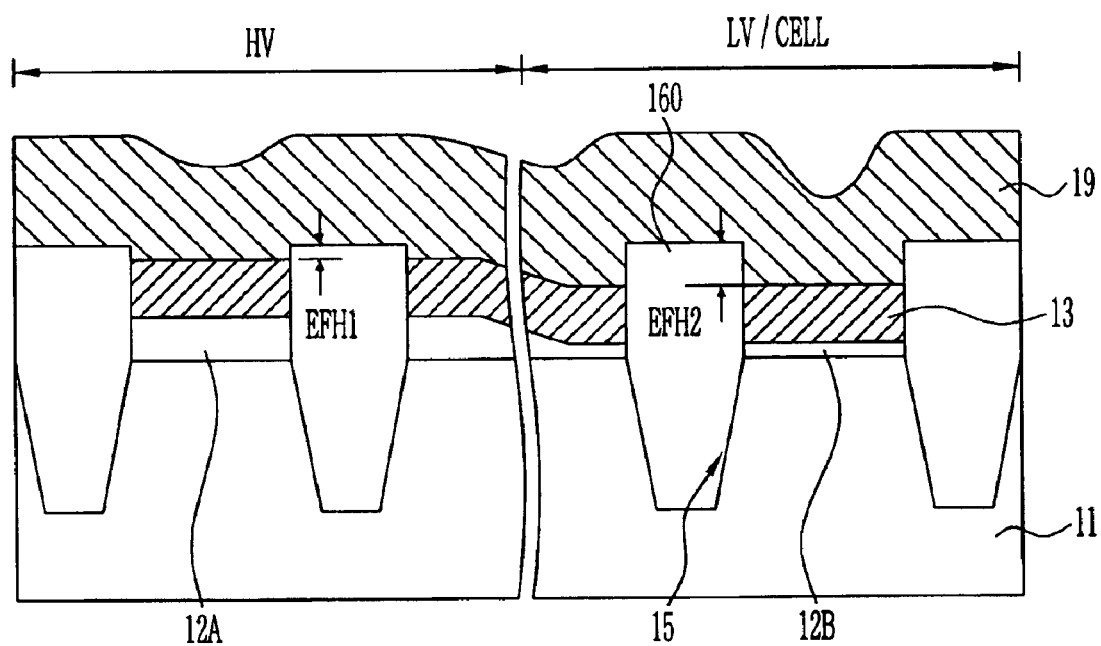
FIG. 1 is a cross-sectional view illustrating a conventional method of manufacturing a flash memory device; and, FIGS. 2A to 2F are cross-sectional views illustrating a method of manufacturing a flash memory device according to the present invention.

The present invention will be described in detail by way of the preferred embodiment with reference to the accompanying drawings, in which like reference numerals are used to identify the same or similar parts.

Shown in FIGS. 2A to 2F are cross-sectional views for illustrating a method of manufacturing a flash memory device formed by applying a SA-STI scheme according to an embodiment of the present invention.

Although a flash memory device includes a cell area, a low voltage transistor area, and a high voltage transistor area—the cell area and the low voltage transistor area will be considered as one area—the low voltage transistor/cell area—in the following description for easier understanding because the thickness of their gate oxides is similar to each other.

Figure 2A:
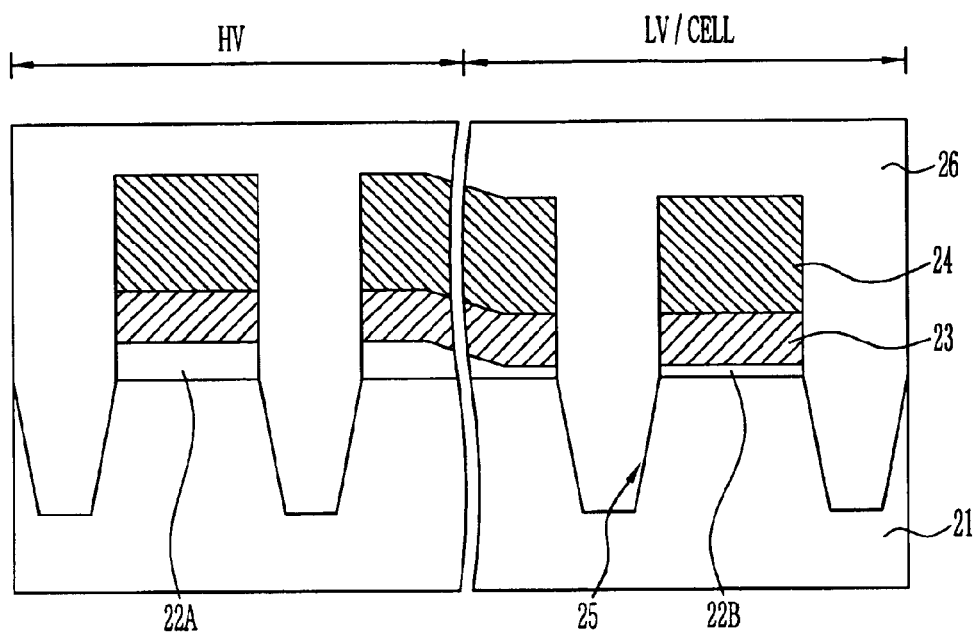

Referring to FIG. 2A, a gate oxide film 22A for a high voltage is formed on a semiconductor substrate 21 in the high voltage transistor area HV, and a gate oxide film 22B for a low voltage/cell is formed on the semiconductor substrate 21 in the low voltage transistor/cell area LV/CELL. The gate oxide film 22A in the high voltage transistor area HV is formed to be thicker than the gate oxide film 22B in the low voltage transistor/cell area LWCELL. A first poly-silicon layer 23 for a floating gate is formed on the gate oxide films 22A and 22B. A plurality of isolation trenches are formed on the semiconductor substrate 21 in the high voltage transistor area HV and the low voltage transistor/cell area LV/CELL by forming a nitride film 24 on the first poly-silicon layer 23 and then performing an etching process using an SA-STI scheme for the nitride film 24, the first poly-silicon layer 23, the gate oxide film 22A and 22B, and the semiconductor substrate 21. An oxide film for element isolation 26 is formed to cover the whole structure, including the isolation trenches 25 so as to sufficiently fill the trenches 25. The oxide film for element isolation 26 is usually made of a material having an excellent gap filling capability and a high insulating characteristic, such as an HDP oxide.

Figure 2B:
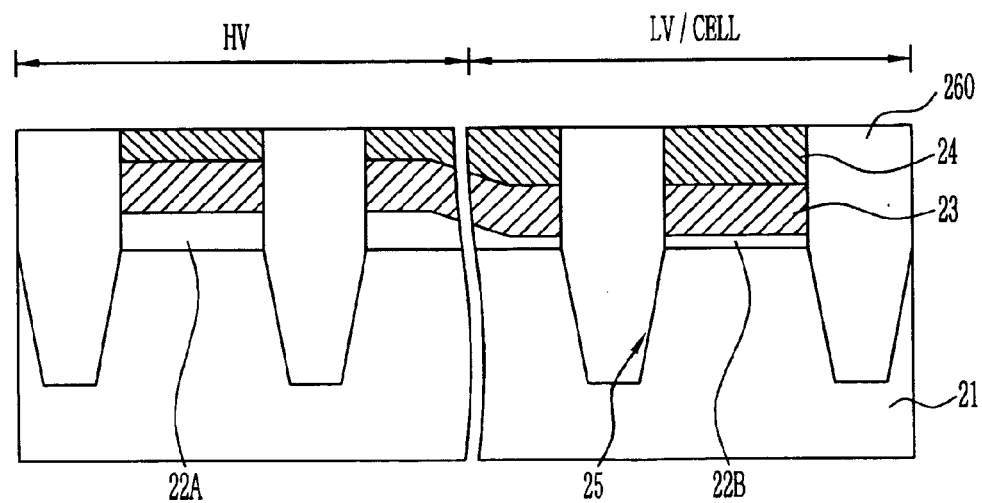

Referring to FIG. 2B, a chemical mechanical polishing process is performed to form element isolation films 260 in the trenches 25 just until the surface of the first poly-silicon layer 23 in the high voltage transistor area HV is exposed. As recognized in the drawing, there is a difference in the heights of the remaining nitride film 24 and the protruding portions of the element isolation films 260 based on the surface of the first poly-silicon layer 23 between the high voltage transistor area HV and the low voltage transistor/cell area. As described above in the conventional method, the EFH's of the element isolation films 260 in the high voltage transistor area HV are smaller than those in the low voltage transistor/cell area LV/CELL so that there is a difference between both areas. This causes the problems as described above in the conventional method.

Referring to FIG. 2C, the remaining nitride films 24 are removed. Then, a buffer oxide film 27 is formed to cover the surfaces of the first poly-silicon layer 23 and the element isolation films 260 having different heights. Also, a planarizing film 28 is formed on the buffer oxide film 27.

In the above description, the buffer oxide film 27 has a thickness of about 100 Π or less, preferably about 20 to about 100 Π, in order to prevent contamination that may occur when the planarizing film 28 directly contacts the first poly-silicon layer 23. Also, the buffer oxide film 27 is not required but, preferable is present to prevent the contamination. The planarizing film 28 is made of a material that has high fluidity and excellent planarization, such as a spin on glass (SOG) or a boron phosphorous silicate glass (BPSG) having a thickness in the range of about 300 Π to about 800 Π.

Referring to FIG. 2D, a photo resist pattern 30 is formed on the planarizing film 28 to open the low voltage transistor/cell area LV/CELL and close the high voltage transistor area HV. The planarizing film 28 and the element isolation films in the low voltage transistor/cell area LV/CELL are removed to a certain thickness by an etching process using a photo resist pattern 30 as an etching mask.

In the above description, a wet etching may be performed by using an oxide etching solution with HF added. Under the same etching condition, the etching rate of a planarizing film 28 formed by an SOG or a BPSG is faster than that of an element isolation film 260 formed by an HDP. By such etching processes, the upper portions of the element isolation films 260 in the low voltage transistor/cell area LV/CELL are partially removed to reduce the EFH's.

Figure 2E:
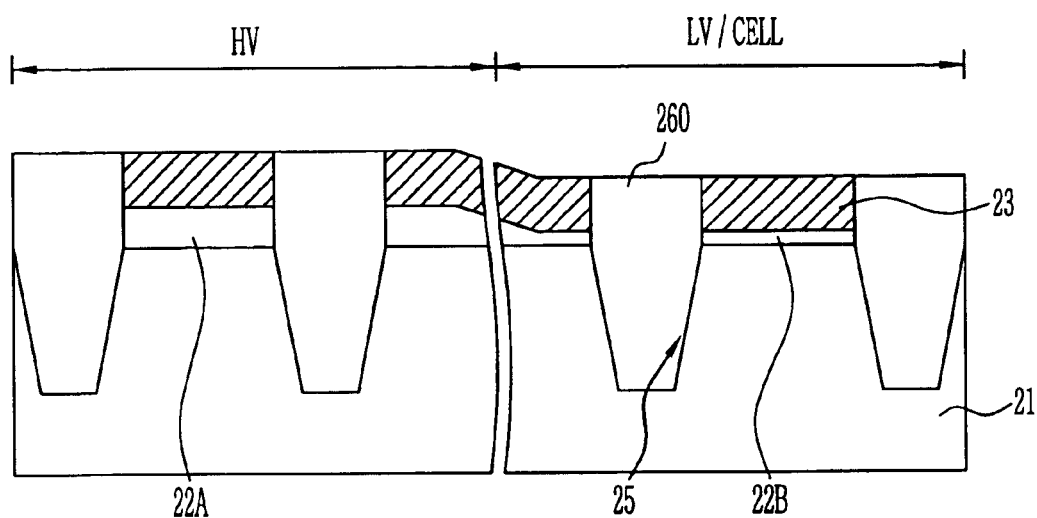

Referring to FIG. 2E, the photo resist pattern 30 is removed. Then, the planarizing film 28, the buffer oxide film 27, and the element isolation films 260 in the high voltage transistor area HV and the low voltage transistor/cell area LWCELL are removed by a blanket etching process.

In the above description, the photo resist pattern 30 is removed by a wet or dry method. The blanket etching process is performed by a wet etching using an oxide etching solution with HF added until the first poly-silicon layer 23 is exposed. Under the same etching conditions, the etching rate of the planarizing film 28 formed by an SOG or a BPSG is faster than that of the element isolation film 260 formed by an HDP. By such etching processes, the upper portions of the element isolation films 260 in the high voltage transistor area HV as well as the low voltage transistor/cell area LV/CELL are partially removed to reduce the EFH's of the element isolation films 260 in each of areas HV and LV/CELL. As a result, the EFH's of the element isolation films 260 in the high voltage transistor area HV and the low voltage transistor/cell area LV/CELL are about (−) 100 to about 50 Π. Therefore, it is possible to remarkably reduce the difference in the EFH's between the both areas HV and LV/CELL. Meanwhile, if a wet etching is used to remove the photo resist pattern 30, it is possible to perform the etching process that uses a photo resist pattern 30 as an etching mask shown in FIG. 2D, the process of removing the photo resist pattern shown in FIG. 2E, and the blanket etching process shown in FIG. 2E in the same machine in a sequential manner.

Figure 2F:
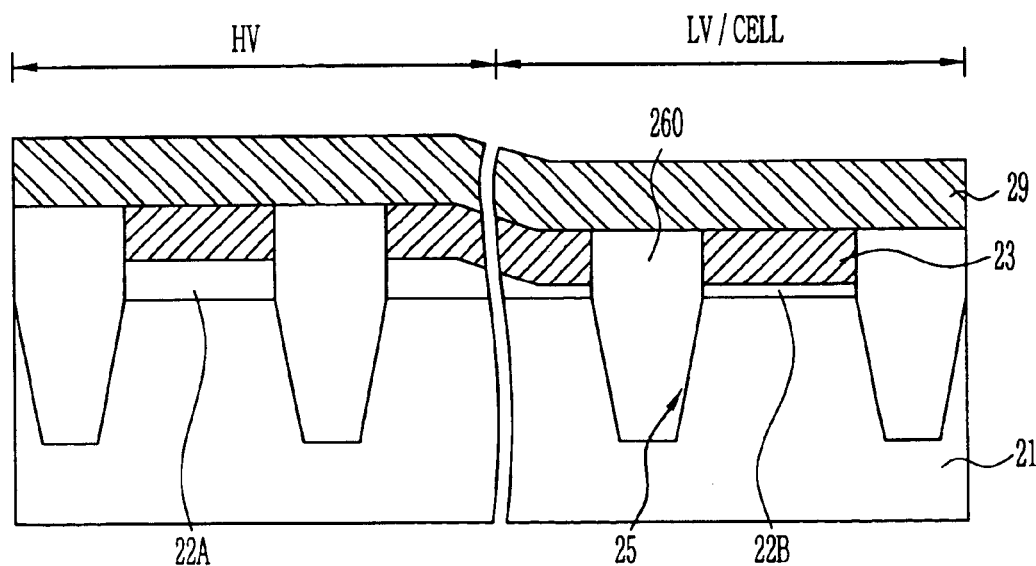

Referring to FIG. 2F, the surfaces of the element isolation films 260 and the first poly-silicon layer 23 are planarized on the whole area, HV and LV/CELL, without any step. Then, the second poly-silicon layer 29 for a floating gate is formed on the planarized surface. Although it is not shown in the drawings, gates are formed in each area by performing the subsequent processes, such as an etching process using a mask for a floating gate, a process of forming a dielectric film, a process of forming a conduction layer for a control gate, and an etching process using a mask for a control gate.

As described above, according to the present invention, it is possible to reduce a difference in effective field oxide heights between a high voltage transistor area and a low voltage transistor/cell area, which is caused by respective protruding portions of element isolation films thereon, thus ensuring process safety and improving device reliability.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method of manufacturing a flash memory device, the method comprising the steps of;
   (a) providing a semiconductor substrate having a high voltage transistor area in which a first gate oxide film and a first poly-silicon layer are formed between first element isolation films, and a low voltage transistor/cell area in which a second gate oxide film and the first poly-silicon layer are formed between second element isolation films;
   (b) forming a planarizing film on the surfaces of the first poly-silicon layer and the first and second element isolation films;
   (c) performing a first etching process to remove upper portions of the planarizing film and the element isolation films in the low voltage transistor/cell area to a certain thickness;
   (d) performing a second etching process to remove upper portions of the planarizing film and the element isolation films in the high voltage transistor area and the low voltage transistor/cell area; and,
   (e) forming a second poly-silicon layer on the surfaces of the first poly-silicon layer and the element isolation films.

2. The method of claim 1, wherein the planarizing film is formed by using an SOG or a BPSG to have a thickness in the range of about 300 Π to about 800 Π.

3. The method of claim 1, further comprising the step of forming a buffer oxide film between the first poly-silicon layer and the planarizing film.

4. The method of claim 3, wherein the buffer oxide film has a thickness in the range of about 20 Π to about 100 Π.

5. The method of claim 1, wherein the first and second etching processes comprise a wet etching process using an oxide etching solution with HF added.

6. The method of claim 1, further comprising forming, prior to step (c), a photo resist pattern to close the high voltage transistor area and open the low voltage transistor/cell area.

7. The method of claim 6, further comprising removing the photo resist pattern by a wet or dry etching after the first etching process is completed.

8. The method of claim 1, further comprising performing the first and second etching processes to obtain an oxide height (EFH) in the high voltage transistor area and the low voltage transistor/cell area of about (−) 100 Π to about 50 Π.

* * * * *

UNITED STATES PATENT AND TRADEMARK OFFICE
CERTIFICATE OF CORRECTION

PATENT NO. : 6,884,682 B2  
DATED : April 26, 2005  
INVENTOR(S) : Byoung Ki Lee It is certified that error appears in the above-identified patent and that said Letters Patent is hereby corrected as shown below:

Column 2,  
Line 6, delete "100 Π" and insert -- 100 Å --.  
Line 9, delete "300 Π" and insert -- 300 Å --; delete "800 Π" and insert -- 800 Å --.  
Line 56, delete "50 Π" and insert -- 50 Å --.

Column 3,  
Lines 62 and 63, delete "100 Π" and insert -- 100 Å --.

Column 4,  
Line 3, delete "300 Π" and insert -- 300 Å --.  
Lines 3-4, delete "800 Π" and insert -- 800 Å --.  
Line 40, delete "50 Π" and insert -- 50 Å --.

Column 6,  
Line 6, delete "300 Π" and insert -- 300 Å --; delete "800 Π" and insert -- 800 Å --.  
Line 11, delete "20 Π" and insert -- 20 Å --; delete "100 Π" and insert -- 100 Å --.  
Line 24, delete "100 Π" and insert -- 100 Å --; delete "50 Π" and insert -- 50 Å --.

Signed and Sealed this

Second Day of May, 2006

JON W. DUDAS  
*Director of the United States Patent and Trademark Office*